US009035703B2

(12) United States Patent
Feng et al.

(10) Patent No.: US 9,035,703 B2
(45) Date of Patent: May 19, 2015

(54) TUNABLE WIDE BAND DRIVER AMPLIFIER

(71) Applicant: QUALCOMM Incorporated, San Diego, CA (US)

(72) Inventors: Haigang Feng, San Diego, CA (US); Vinod V Panikkath, San Diego, CA (US); Janakiram G Sankaranarayanan, San Diego, CA (US); Bhushan Shanti Asuri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 65 days.

(21) Appl. No.: 13/775,026

(22) Filed: Feb. 22, 2013

(65) Prior Publication Data

US 2014/0167864 A1 Jun. 19, 2014

Related U.S. Application Data

(60) Provisional application No. 61/738,251, filed on Dec. 17, 2012.

(51) Int. Cl.
*H03F 3/191* (2006.01)
*H03G 9/24* (2006.01)
*H03F 1/22* (2006.01)
(Continued)

(52) U.S. Cl.
CPC ............ *H03G 9/24* (2013.01); *H03F 1/223* (2013.01);
(Continued)

(58) Field of Classification Search
CPC .............. H03F 2200/372; H03F 2200/294; H03F 3/45475; H03F 2200/451; H03F 1/26; H03F 3/191; H03F 1/56; H03F 1/565; H03F 2200/222; H03F 3/193; H03F 1/48; H03F 3/19
USPC .............. 330/277, 302, 305, 306, 311
See application file for complete search history.

(56) References Cited

U.S. PATENT DOCUMENTS 6,023,611 A 2/2000 Bolin et al.
6,650,185 B1 11/2003 Stengel et al.
(Continued)

FOREIGN PATENT DOCUMENTS

EP 0911985 A2 4/1999

OTHER PUBLICATIONS

International Search Report and Written Opinion—PCT/US2013/075880—ISA/EPO—Feb. 5, 2014.

*Primary Examiner* — Khanh V Nguyen
(74) *Attorney, Agent, or Firm* — Ramin Morbarhan

(57) ABSTRACT

A tunable wide band driver amplifier is disclosed. In an exemplary embodiment, an apparatus includes a first band selection circuit selectively connected between an output terminal of an amplifier and a circuit ground. The first band selection circuit configured to adjust an amplification band from a first frequency band to a second frequency band. The apparatus also includes a first harmonic reduction circuit selectively connected between the first band selection circuit and the circuit ground and configured to reduce $2^{nd}$ harmonic frequencies associated with the first frequency band when the amplification band is set to the first frequency band.

20 Claims, 3 Drawing Sheets

(51) Int. Cl.
*H03F 1/42* (2006.01)
*H03F 1/56* (2006.01)
*H03F 3/193* (2006.01)
*H03F 3/24* (2006.01)

(52) U.S. Cl.
CPC .................. *H03F 1/42* (2013.01); *H03F 1/565* (2013.01); *H03F 3/193* (2013.01); *H03F 3/245* (2013.01); *H03F 2200/06* (2013.01); *H03F 2200/111* (2013.01); *H03F 2200/36* (2013.01); *H03F 2200/378* (2013.01); *H03F 2200/387* (2013.01); *H03F 2200/39* (2013.01); *H03F 2200/391* (2013.01); *H03F 2200/534* (2013.01)

(56) References Cited

U.S. PATENT DOCUMENTS

| | | | |
|---|---|---|---|
| 7,173,505 | B2 | 2/2007 | Behzad et al. |
| 7,202,734 | B1 * | 4/2007 | Raab .............................. 330/306 |
| 7,202,736 | B1 * | 4/2007 | Dow et al. ...................... 330/302 |
| 7,567,128 | B2 | 7/2009 | Oka et al. |
| 7,764,125 | B2 * | 7/2010 | Dawe ............................. 330/305 |
| 7,949,322 | B2 | 5/2011 | Kim et al. |
| 8,228,123 | B2 | 7/2012 | Blednov |
| 8,629,725 | B2 * | 1/2014 | Scott et al. ..................... 330/305 |
| 2008/0290947 | A1 | 11/2008 | Dawe |
| 2010/0308933 | A1 | 12/2010 | See et al. |
| 2012/0087282 | A1 | 4/2012 | Shibahara |

* cited by examiner

TUNABLE WIDE BAND DRIVER AMPLIFIER

CLAIM OF PRIORITY UNDER 35 U.S.C. §119

This patent application claims the benefit of priority from U.S. Provisional Patent Application No. 61/738,251, entitled "TUNABLE WIDEBAND DRIVER AMPLIFIER" filed on Dec. 17, 2012, and assigned to the assignee hereof and hereby expressly incorporated by reference herein.

BACKGROUND

1. Field

The present application relates generally to the operation and design of analog front ends, and more particularly, to the operation and design of driver amplifiers for use in analog front ends.

2. Background

Wireless devices have become increasingly more complex resulting in more circuitry being incorporated onto smaller chips and circuit boards. For example, a conventional transmitter used in a wireless device may include multiple driver amplifiers (DA) to amplify signals in both low frequency and high frequency bands, respectively. Having a dedicated DA for a specified frequency band may achieve the desired amplification goals; however such an implementation also may have several disadvantages. For example, utilizing multiple DAs may result in increased costs in terms of die area requirements. Furthermore, other circuitry in the transmitter, such as an up-converter, may need to be modified to support multiple DA configurations, thereby increasing the complexity of the transmitter.

Accordingly, what is needed is a highly efficient wide band driver amplifier that is configured to reduce die area and transmitter design complexity in wireless devices.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
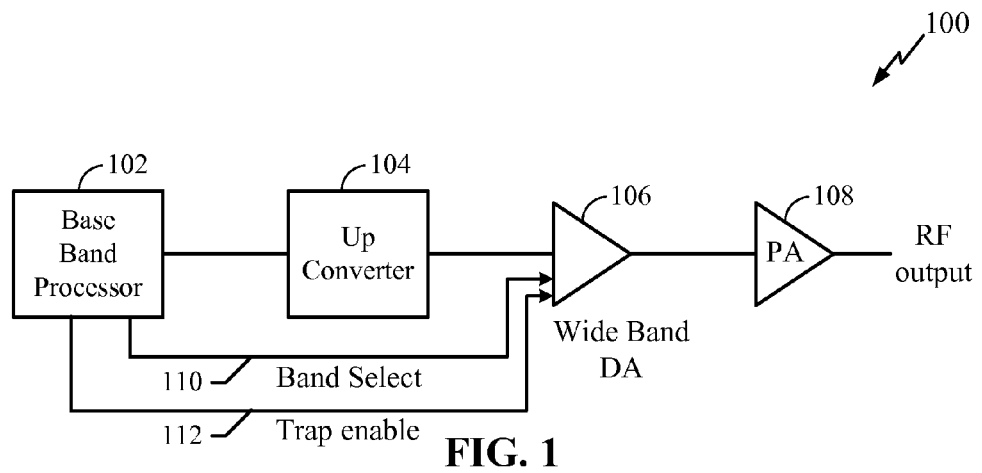
FIG. 1 shows a transmitter for use in a device that includes an exemplary embodiment of a tunable wide band driver amplifier.

FIG. 1 shows a transmitter 100 for use in a device that includes an exemplary embodiment of a novel tunable wide band DA 106. The transmitter 100 comprises a baseband processor 102 that outputs baseband data to be transmitted to an up-converter 104. The up-converter 104 up-converts the baseband data to a radio frequency (RF) signal and inputs this RF signal to the tunable wide band DA 106. The tunable DA 106 is configured to provide amplification over a wide frequency range (i.e., 800 Mhz to 2.4 GHz) that is divided into two selectable frequency bands. The tunable DA 106 receives a band select signal 110 from the baseband processor 102. The band select signal 110 selects one of the two selectable bands over which amplification will be provided. The tunable DA 106 also receives a trap enable signal 112 from the baseband processor 102. The trap enable signal 112 enables or disables a trap circuit that provides attenuation of $2^{nd}$ harmonic and higher frequencies for the amplified output. The amplified output of the tunable DA 106 is then input to a power amplifier (PA) 108 where the RF signal is further amplified for transmission. In various exemplary embodiments, the tunable DA 106 provides amplification over a wide frequency range and is configured to reduce die area by half when compared to conventional DA configurations that utilize multiple amplifiers.

Figure 2:
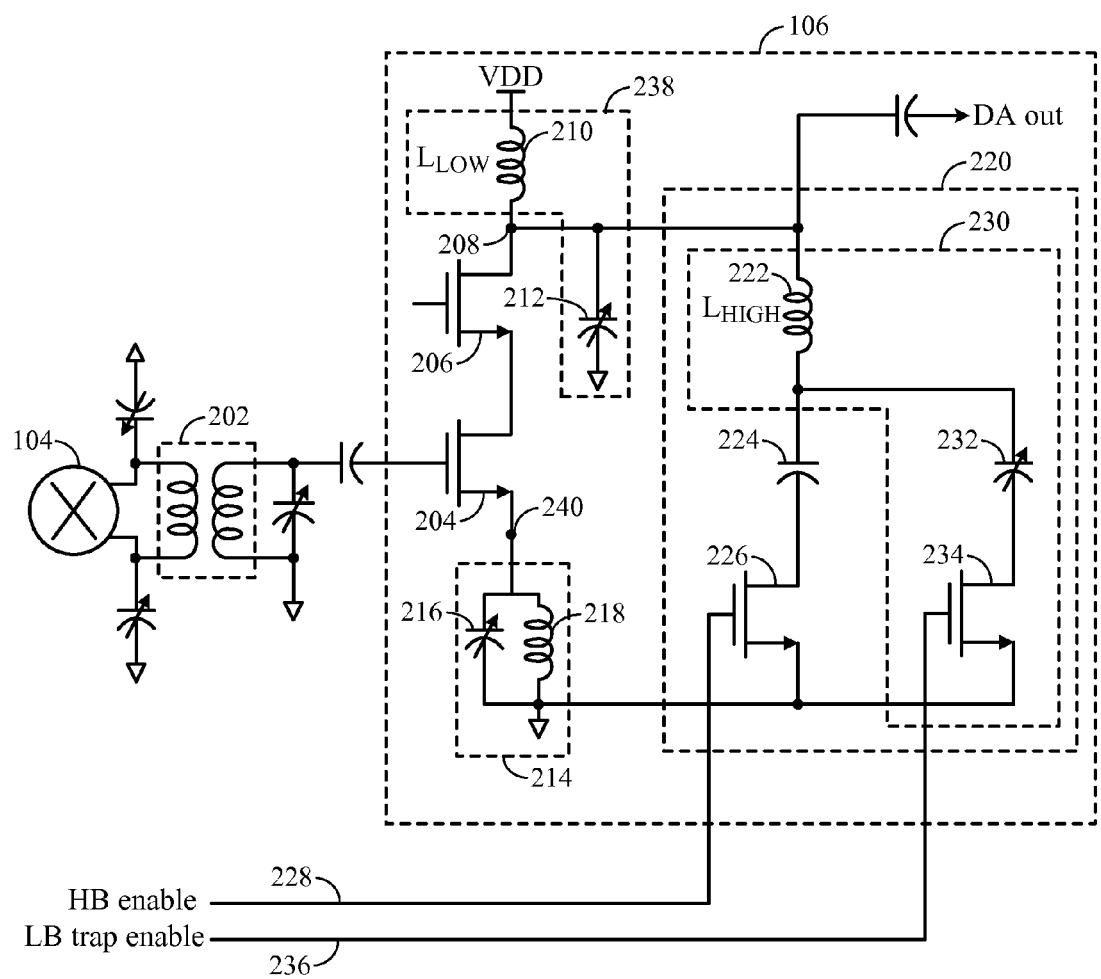
FIG. 2 shows a detailed exemplary embodiment of the tunable wide band driver amplifier illustrated in FIG. 1.

FIG. 2 shows a detailed exemplary embodiment of the tunable wide band driver amplifier 106 illustrated in FIG. 1. The upconverter 104 outputs a differential signal to a balun 202 that converts the differential signal to a single-ended signal. The single-ended signal is input to transistor 204 of the DA 106. The transistor 204 operates with transistor 206 to amplify the single-ended signal to generate an amplified output signal (DA output) at the drain terminal 208 of transistor 206. It should be noted that although the transistors 204, 206 are configured as a cascode pair, the amplifier 106 may utilize any suitable transistor configuration.

In an exemplary embodiment, a first band selection circuit 238 operates to set the amplification band of the amplifier to a first frequency band. The first frequency band (also referred to herein as the low frequency band) has a center frequency designated as ($f_{LB}$). The first band selection circuit 238 comprises an inductor $L_{LOW}$ 210 and variable capacitor 212. The inductor $L_{LOW}$ 210 is connected between the drain terminal 208 and a supply voltage (VDD). The variable capacitor 212 is connected between the drain terminal 208 and a circuit ground. In an exemplary embodiment, the inductor $L_{LOW}$ 210 has a large inductance value (i.e., 4 nH) and the variable capacitor 212 has a tunable capacitance range (i.e., 1-10 pf). The inductor $L_{LOW}$ 210 and the variable capacitor 212 combine to set the first frequency band of operation for the DA 106. In an exemplary embodiment, the inductor $L_{LOW}$ 210 and the variable capacitor 212 are configured to tune the center frequency ($f_{LB}$) of the first frequency band from 800 MHz to 1.4 GHz.

A low band trap circuit 230 operates to provide $2^{nd}$ harmonic frequency reduction for the amplified DA output signal when operating in the first frequency band of operation. The low band trap circuit 230 comprises a variable capacitor 232 connected between an inductor $L_{HIGH}$ 222 and a drain terminal of transistor 234. The inductor $L_{HIGH}$ 222 also is connected to the drain terminal 208. In an exemplary embodiment, the capacitor 232 has a tunable capacitance value in the range of 1-6 pf and the inductor $L_{HIGH}$ 222 has an inductance value of 2 nH. The transistor 234 has a source terminal connected to the circuit ground and a gate terminal that is controlled by a low band (LB) trap enable signal 236. For example, when the LB trap enable signal 236 is in a "high voltage" or "enable" state, the transistor 234 is turned on so that the capacitor 232 is coupled to the circuit ground. When the LB trap enable signal 236 is in a "low voltage" or "disable" state, the transistor 234 is turned off so that the capacitor 232 is de-coupled from the circuit ground. In an exemplary embodiment, the trap enable signal 112 illustrated in FIG. 1 comprises the LB trap enable signal 236 and is generated by the baseband processor 102 or some other entity at the device.

When the LB trap enable signal 236 enables (or turns on) the transistor 234 so that the capacitor 232 is coupled to the circuit ground, the combination of the inductor $L_{HIGH}$ 222 and the capacitor 232 operate to form a low band trap circuit to provide $2^{nd}$ harmonic frequency reduction for the amplified DA output signal when in the low frequency band of operation. For example, when the low band trap circuit 230 is enabled, DA output frequencies at and above the $2^{nd}$ harmonic frequency (2 $f_{LB}$) of the low band center frequency ($f_{LB}$) are reduced or attenuated.

In an exemplary embodiment, a second band selection circuit 220 operates to set the amplification band of the DA 106 to a second frequency band. The second frequency band (also is referred to herein as the high frequency band) has a center frequency designated as ($f_{HB}$). The second band selection circuit 220 includes the low band trap circuit 230. In an exemplary embodiment, the second band selection circuit 220 also comprises the inductor $L_{HIGH}$ 222 connected in series with a capacitor 224. For example, in an exemplary embodiment, the capacitor 224 has a fixed capacitance value of 10 pf. The capacitor 224 is further connected to a drain terminal of transistor 226, which also has a source terminal connected to the circuit ground. The transistor 226 has a gate terminal that is connected to and controlled by a high band (HB) enable signal 228. For example, when the HB enable signal 228 is in a "high voltage" or "enable" state, the transistor 226 is turned on so that the capacitor 224 is coupled to the circuit ground. When the HB enable signal 228 is in a "low voltage" or "disable" state, the transistor 226 is turned off so that the capacitor 224 is de-coupled from the circuit ground. In an exemplary embodiment, the band select signal 110 illustrated in FIG. 1 comprises the HB enable signal 228 and is generated by the baseband processor 102 or some other entity at the device.

In an exemplary embodiment, when both the HB enable signal 228 and the LB trap enable signal 236 are set to the enabled state, the transistors 226 and 234 are enabled (i.e., turned on) so that the capacitors 224 and 232 are coupled to the circuit ground. This configuration combines the capacitance values of the capacitors 224 and 232 to create a combined capacitance value of 10-16 pf depending on the tuning of the capacitor 232. This combined capacitance in combination with the inductor $L_{HIGH}$ 222, the inductor $L_{LOW}$ 210, and the capacitor 212 operate to adjust the amplification band of the DA 106 to the second (or high) frequency band. In an exemplary embodiment, the second band selection circuit 220 is configured to tune the center frequency ($f_{HB}$) of the second frequency band from 1.4 GHz to 2.4 GHz.

A tank circuit 214 comprising tunable capacitor 216 and inductor 218 is connected between a source terminal 240 of the transistor 204 and the circuit ground. The tank circuit 214 operates to provide $2^{nd}$ harmonic reduction when the amplification band of the DA 106 is set to the second (or high) frequency band. In an exemplary embodiment, the inductor 218 has an inductance value of 0.25 nH and the tunable capacitor 216 has a capacitance value in the range of 0.5-4 pf. For example, the tank circuit 214 operates so that DA output frequencies at and above a $2^{nd}$ harmonic (2 $f_{HB}$) of the high band center frequency ($f_{HB}$) are reduced or attenuated. For example, the tank circuit 214 presents a high impedance at high order harmonic frequencies of the high band (i.e., $2^{nd}$ harmonic (2 $f_{HB}$) and higher frequencies) to suppress the generation of such frequencies. At the fundamental frequency ($f_{HB}$), the tank 214 will show considerably lower impedance and have minor impact to the gain of the common source stage. Furthermore, at the low frequency band, the inductor 218 will have little effect and the tunable capacitor 216 can be disabled or turned off In various exemplary embodiments, the values of the inductors $L_{LOW}$ 210, $L_{HIGH}$ 222 and variable capacitors 212, 216, and 232 may be set during manufacturer, during installation, or during operation. In an exemplary embodiment, the values of the inductors $L_{LOW}$ 210 and $L_{HIGH}$ 222 are determined at manufacture and the values of the variable capacitors 212, 216, and 232 are determined during operation by the base band processor 102. For example, in an exemplary embodiment, the band select signal 110 that is output from the base band processor 102 comprises control signals (not shown in FIG. 2) that enable, disable and select the capacitance values of the variable capacitors 212, 216, and 232.

During operation of the wide band DA 106, the enable signals 228 and 236 are used to set the amplification band of the DA 106 to either the first (low) or second (high) frequency bands. For each frequency band, $2^{nd}$ harmonic reduction is automatically enabled or can be selectively enabled to reduce or attenuate output frequencies at and above the $2^{nd}$ harmonic frequency of the selected band's center frequency. A more detailed description of the operation of the wide band driver amplifier 106 is provided below.

Figure 3:
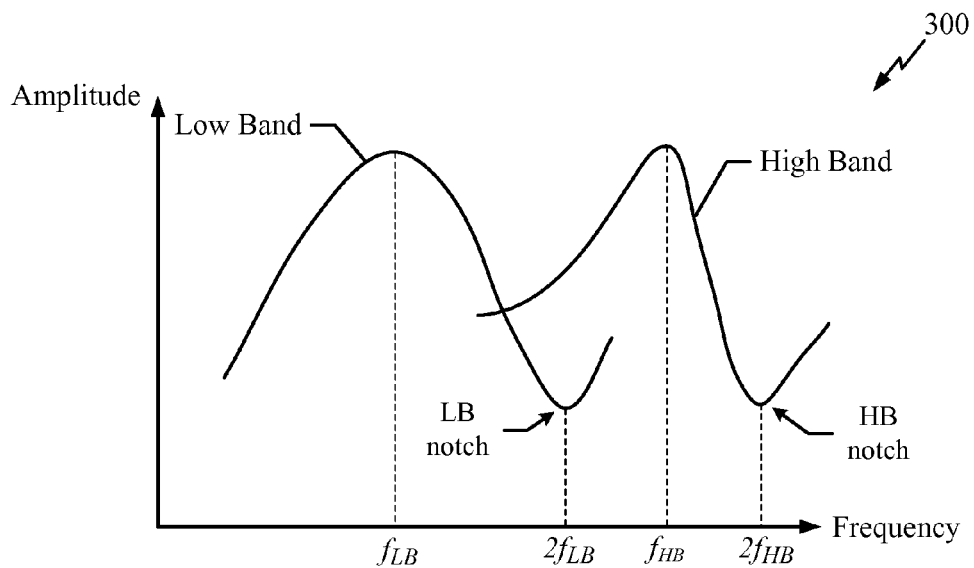
FIG. 3 shows a frequency plot that illustrates the wide band frequency range of the output of the driver amplifier shown in FIG. 2.

FIG. 3 shows a frequency plot 300 that illustrates amplification over the wide frequency range (i.e., 800 MHz-2.4 GHz) of the DA output of the driver amplifier 106. The plot 300 shows amplification over the low frequency band having a tunable fundamental frequency ($f_{LB}$). Operation in the low frequency band is determined from operation of the first (or low) band selection circuit 238. The plot 300 also shows the $2^{nd}$ harmonic attenuation (LB notch) at the $2^{nd}$ harmonic of the low band frequency (2 $f_{LB}$) provided by the LB trap circuit 230.

The plot 300 also shows amplification over the high frequency band having a tunable fundamental frequency ($f_{HB}$). Operation in the high frequency band is determined from operation of the second (or high) band selection circuit 220. The plot 300 shows the $2^{nd}$ harmonic attenuation (HB notch) at the $2^{nd}$ harmonic of the high band frequency (2 $f_{LB}$) provided by the high band $2^{nd}$ harmonic trap circuit 214.

Figure 4:
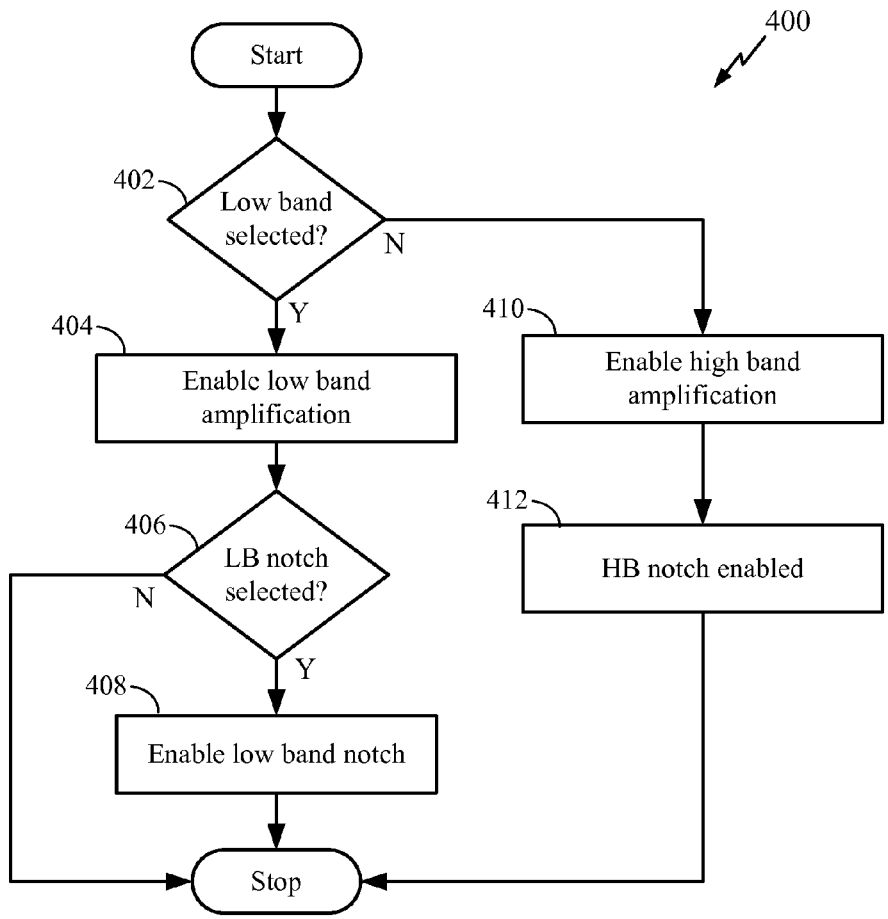
FIG. 4 shows an exemplary embodiment of a method for wide band amplification in a wireless device.

FIG. 4 shows an exemplary embodiment of a method 400 for wide band amplification in a wireless device. For example, the method 400 is suitable for use with the driver amplifier 106 shown in FIG. 2.

At block 402, a determination is made to determine whether amplification in a low frequency band is selected. For example, the base band processor 102 outputs the HB enable signal 228 to set the amplification band. If the HB enable signal 228 is disabled, then amplification in the low frequency band is selected. If the HB enable signal 228 is enabled, then amplification in the high frequency band is selected. If amplification in the low frequency band is selected, the method proceeds to block 404. If amplification in the high frequency band is selected, the method proceeds to block 410.

At block 404, amplification in the low band is enabled. In an exemplary embodiment, the HB enable signal 228 is set to the disabled state so that the transistor 226 is disabled thereby de-coupling the capacitor 224 from the circuit ground. As a result, the low band selection circuit 238 comprising the inductor $L_{LOW}$ 210 and capacitor 212 sets the tunable center frequency ($f_{LB}$) for amplification in the low band. In an exemplary embodiment, the inductor $L_{LOW}$ 210 and the variable capacitor 212 are configured to tune the center frequency ($f_{LB}$) of the first (low) frequency band from 800 MHz to 1.4 GHz.

At block 406, a determination is made as to whether a low band notch filter is to be enabled. For example, the base band processor 102 outputs the LB trap enable signal 236 that is used to determine if the low band notch filter is to be enabled. If the LB trap enable signal 236 is disabled, then the low band notch filter is disabled and the method ends. If the LB trap enable signal 236 is enabled, then the low band notch filter is to be enabled and the method proceeds to block 408.

At block 408, the low band notch is enabled. In an exemplary embodiment, the LB trap enable signal 236 operates to enable the low band trap circuit 230 so that the transistor 234 couples the capacitor 232 to the circuit ground. The combination of the inductor $L_{HIGH}$ 222 and the capacitor 232 operate to provide a low band trap to reduce or attenuate frequencies at and above the low band $2^{nd}$ harmonic frequency ($2 f_{LB}$).

At block 410, high band amplification is enabled. In an exemplary embodiment, the HB enable signal 228 is set to the enabled state so that the transistor 226 is enabled thereby coupling the capacitor 224 to the circuit ground. As a result, the second band selection circuit 220 is enabled. Additionally, the LB trap circuit 230 is enabled by the LB trap enable signal 236. The combination of the inductor $L_{HIGH}$ 222, capacitor 224 and capacitor 232 operates to push or adjust the amplification band of the amplifier 106 to the high band. For example, the center frequency is tuned to ($f_{HB}$) to provide amplification in the high band.

At block 412, the high band notch filter is enabled. In an exemplary embodiment, the tank circuit 214 comprising the combination of the inductor 218 and the capacitor 216 operate to provide a high band trap to reduce or attenuate frequencies at and above the high band $2^{nd}$ harmonic frequency ($2 f_{HB}$).

Accordingly, the method 400 provides for wide band amplification in a wireless device that reduces the required die area over conventional amplifiers. It should be noted that the operations of the method 400 can be rearranged, modified or changed by one with skill in the art such that other equivalent methods are possible.

Figure 5:
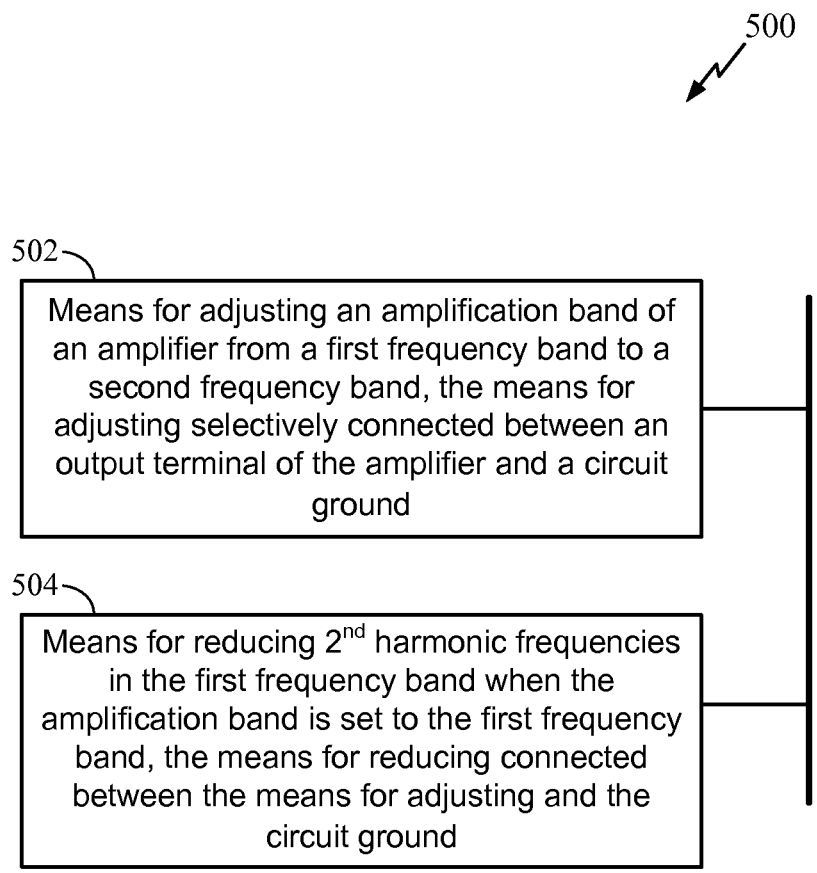
FIG. 5 shows an exemplary embodiment of a tunable wide band driver amplifier apparatus.

FIG. 5 shows an exemplary embodiment of a wide band driver amplifier apparatus 500. For example, the apparatus 500 is suitable for use with the driver amplifier 106 shown in FIG. 2. In an aspect, the apparatus 500 is implemented by one or more modules configured to provide the functions as described herein. For example, in an aspect, each module comprises hardware and/or hardware executing software.

The apparatus 500 comprises a first module comprising means (502) for adjusting an amplification band of an amplifier from a first frequency band to a second frequency band, the means for adjusting selectively connected between an output terminal of the amplifier and a circuit ground, which in an aspect comprises the second band selection circuit 220.

The apparatus 500 comprises a second module comprising means (504) for reducing $2^{nd}$ harmonic frequencies in the first frequency band when the amplification band is set to the first frequency band, the means for reducing connected between the means for adjusting and the circuit ground, which in an aspect comprises the first harmonic reduction circuit 230.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus, comprising:
   a first band selection circuit selectively connected between an output terminal of an amplifier and a circuit ground and configured to adjust an amplification band from a first frequency band to a second frequency band;
   a second band selection circuit that sets the amplification band to the first frequency band, the second band selection circuit having a selected capacitor connected between the output terminal and the circuit ground; and
   a first harmonic reduction circuit selectively connected between the first band selection circuit and the circuit ground and configured to reduce $2^{nd}$ harmonic frequencies associated with the first frequency band when the amplification band is set to the first frequency band.

2. The apparatus of claim 1, the second band selection circuit comprising:
   a first inductor connected between the output terminal and a supply voltage.

3. The apparatus of claim 1, the first band selection circuit comprising:
   a first inductor connected to the output terminal;
   a first capacitor connect to the first inductor; and
   a switch configured to selectively connect the first capacitor to the circuit ground to set the amplification band to the second frequency band.

4. The apparatus of claim 3, the first harmonic reduction circuit comprising:
   a second capacitor connected to the first inductor; and
   a switch configured to selectively connect the second capacitor to the circuit ground to enable reduction of the $2^{nd}$ harmonic frequencies in the first frequency band when the amplification band is set to the first frequency band and to tune the center frequency of the second frequency band when the amplification band is set to the second frequency band.

5. The apparatus of claim 1, the amplifier comprising first and second transistors and the output terminal connected to a drain terminal of the first transistor.

6. The apparatus of claim 5, further comprising a second harmonic reduction circuit coupled to a source terminal of the second transistor and configured to reduce $2^{nd}$ harmonic frequencies when the amplification band is set to the second frequency band.

7. The apparatus of claim 6, the second harmonic reduction circuit comprising:
   an inductor connected between the source terminal of the second transistor and the circuit ground; and
   a capacitor connected between the source terminal of the second transistor and the circuit ground.

8. The apparatus of claim 1, the first frequency band having a first center frequency that is lower in frequency than a second center frequency of the second frequency band.

9. An apparatus, comprising:
   means for adjusting an amplification band of an amplifier from a first frequency band to a second frequency band, the means for adjusting selectively connected between an output terminal of the amplifier and a circuit ground;
   means for setting the amplification band of the amplifier to the first frequency band, the means for setting includes means for providing selected capacitance between the output terminal and the circuit ground; and
   means for reducing $2^{nd}$ harmonic frequencies in the first frequency band when the amplification band is set to the first frequency band, the means for reducing connected between the means for adjusting and the circuit ground.

10. The apparatus of claim 9, the means for setting the amplification band of the amplifier to the first frequency band comprising:
    a first inductor connected between the output terminal and a supply voltage.

11. The apparatus of claim 9, the means for adjusting comprising:
    a first inductor connected to the output terminal;
    a first capacitor connect to the first inductor; and
    a switch configured to selectively connect the first capacitor to the circuit ground to set the amplification band to the second frequency band.

12. The apparatus of claim 11, the means for reducing comprising:
    a second capacitor connected to the first inductor; and
    a switch configured to selectively connect the second capacitor to the circuit ground to enable reduction of the $2^{nd}$ harmonic frequencies in the first frequency band when the amplification band is set to the first frequency band and to tune the center frequency of the second frequency band when the amplification band is set to the second frequency band.

13. The apparatus of claim 9, the amplifier comprising first and second transistors and the output terminal connected to a drain terminal of the first transistor.

14. The apparatus of claim 13, further comprising means for trapping connected to a source terminal of the second transistor and configured to reduce $2^{nd}$ harmonic frequencies when the amplification band is set to the second frequency band.

15. The apparatus of claim 14, the means for trapping comprising:
an inductor connected between the source terminal of the second transistor and the circuit ground; and
a capacitor connected between the source terminal of the second transistor and the circuit ground.

16. The apparatus of claim 9, the first frequency band having a first center frequency that is lower in frequency than a second center frequency of the second frequency band.

17. A method comprising:
determining whether an amplification band of an amplifier is to be set to a low frequency band or a high frequency band;
enabling a first band selection circuit having a selected capacitor connected between an output terminal of the amplifier and a circuit ground, and disabling a second band selection circuit connected between the output terminal of an amplifier and the circuit ground if the amplification band is to be set to the low frequency band; and
enabling the first band selection circuit and enabling the second band selection circuit if the amplification band is to be set to the high frequency band.

18. The method of claim 17, further comprising:
determining whether a low band trap circuit is to be enabled if the amplification band is to be set to the low frequency band;
enabling the low band trap circuit to reduce $2^{nd}$ harmonic frequencies associated with the low frequency band if the low band trap circuit is to be enabled.

19. The method of claim 17, further comprising enabling a high band trap circuit to reduce $2^{nd}$ harmonic frequencies associated with the high frequency band if the amplification band is to be set to the high frequency band.

20. The apparatus of claim 17, the low frequency band having a first center frequency that is lower in frequency than a second center frequency of the high frequency band.

* * * * *